United States Patent
Lin et al.

(10) Patent No.: US 9,324,620 B2
(45) Date of Patent: Apr. 26, 2016

(54) METAL GATE STRUCTURE AND METHOD OF MAKING THE SAME

(71) Applicant: UNITED MICROELECTRONICS CORP., Hsin-Chu (TW)

(72) Inventors: Shi-Xiong Lin, Yilan County (TW); Chun-Lung Chen, Tainan (TW); Kun-Yuan Liao, Hsin-Chu (TW); Feng-Yi Chang, Tainan (TW); Yu-Cheng Tung, Kaohsiung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/462,574

(22) Filed: Aug. 19, 2014

(65) Prior Publication Data
US 2016/0005658 A1 Jan. 7, 2016

(30) Foreign Application Priority Data
Jul. 7, 2014 (TW) .............................. 103123373 A

(51) Int. Cl.
*H01L 21/8234* (2006.01)
*H01L 27/088* (2006.01)
*H01L 29/423* (2006.01)

(52) U.S. Cl.
CPC ...... *H01L 21/823456* (2013.01); *H01L 27/088* (2013.01); *H01L 29/42372* (2013.01)

(58) Field of Classification Search
CPC .................. H01L 21/823456; H01L 27/088; H01L 29/42372
See application file for complete search history.

(56) References Cited

U.S. PATENT DOCUMENTS

| | | | |
|---|---|---|---|
| 8,436,404 B2 | 5/2013 | Bohr | |
| 8,450,178 B2 | 5/2013 | Cheng | |
| 8,877,580 B1 * | 11/2014 | Chen | H01L 21/28008 438/221 |
| 2013/0164930 A1 * | 6/2013 | Tu | H01L 21/31053 438/595 |
| 2013/0181265 A1 | 7/2013 | Grasshoff | |
| 2013/0248950 A1 * | 9/2013 | Kang | H01L 29/78 257/288 |

* cited by examiner

*Primary Examiner* — Michelle Mandala
(74) *Attorney, Agent, or Firm* — Winston Hsu; Scott Margo

(57) ABSTRACT

A metal gate structure includes a substrate including a dense region and an iso region. A first metal gate structure is disposed within the dense region, and a second metal gate structure is disposed within the iso region. The first metal gate structure includes a first trench disposed within the dense region, and a first metal layer disposed within the first trench. The second metal gate structure includes a second trench disposed within the iso region, and a second metal layer disposed within the second trench. The height of the second metal layer is greater than the height of the first metal layer.

13 Claims, 5 Drawing Sheets

//METAL GATE STRUCTURE AND METHOD OF MAKING THE SAME

BACKGROUND OF THE INVENTION

1. Field of the Invention

The present invention relates to a metal gate structure and a method of making the same, and more particularly to a method of forming a metal gate structure which has metal gates in the iso region which are higher than metal gates in the dense region.

2. Description of the Prior Art

With the trend towards miniaturization in the semiconductor industry with corresponding improvements in semiconductor manufacturing processes, manufactures are able to form both dense regions and iso regions on one chip.

During an etching process, because the iso regions have larger openings at the surface area than dense regions, the etchant will contact and react with more objective material in the iso regions. Consequently, the etching rate is higher in the iso regions, and more by-products are produced. This can cause gate patterns in the iso regions to be over etched, in some cases, even exposing the material layer within iso regions under gate patterns, which is undesirable.

SUMMARY OF THE INVENTION

Therefore, a method for forming a metal gate in iso regions having a height larger than a metal gate in dense regions is provided in the present invention.

According to a preferred embodiment, a method of making a metal gate structure is provided. The method is applied to a semi-finished product of a metal gate structure, the semi-finished product comprising a substrate, the substrate comprising a dense region and an iso region, a dielectric layer covering the dense region and the iso region, a first trench disposed in the dielectric layer within the dense region, a first gate dielectric layer, a first material layer, and a first metal layer disposed in the first trench, the first gate dielectric layer contacting the substrate, the first material layer disposed between the first metal layer and the first gate dielectric layer, wherein the first material layer is U shaped, and the first material layer has a first vertical sidewall. The method comprises the following steps:

Step (a): removing part of the first vertical sidewall of the first material layer;

Step (b): removing part of the first metal layer to make a top surface of the first metal layer aligned with a top surface of the first vertical sidewall; and Step (d): removing part of the first gate dielectric layer to make a top surface of the first gate dielectric layer aligned with the top surface of the first vertical sidewall.

According to a preferred embodiment, a metal gate structure is provided. The metal gate structure includes a substrate comprising a dense region and an iso region. A first metal gate structure is disposed within the dense region, and a second metal gate structure is disposed within the iso region. The first metal gate structure includes a first trench disposed within the dense region, and a first metal layer disposed within the first trench. The second metal gate structure includes a second trench disposed within the iso region, and a second metal layer disposed within the second trench. The height of the second metal layer is greater than the height of the first metal layer.

These and other objectives of the present invention will no doubt become obvious to those of ordinary skill in the art after reading the following detailed description of the preferred embodiment that is illustrated in the various figures and drawings.

DETAILED DESCRIPTION

The preferred exemplary embodiments of the present invention are illustrated in the accompanying drawings with numbered elements as follows.

FIGS. 1-9 are schematic drawings illustrating a method for making a metal gate structure according to a preferred embodiment of the present invention.

Figure 1:
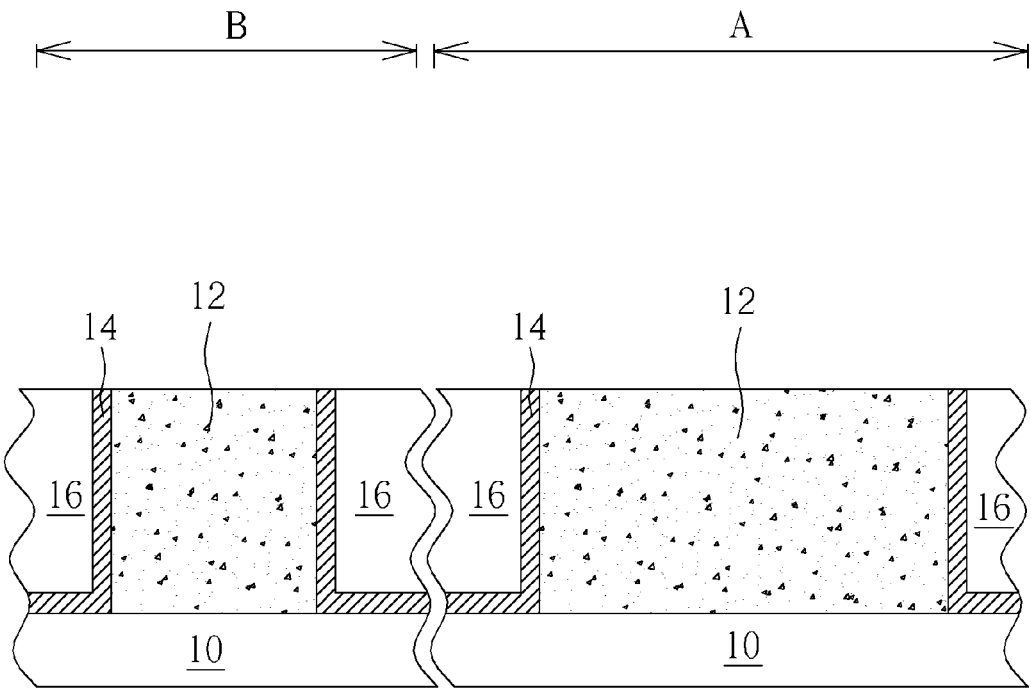
FIGS. 1-9 are schematic drawings illustrating a method for making a metal gate structure according to a preferred embodiment of the present invention.

As shown in FIG. 1, a substrate 10 is provided. The substrate 10 is divided into an iso region A and a dense region B. The density of elements disposed within the iso region A is relatively small, which means the quotient of the entire size of the elements in the iso region A divided by the area of iso region A is also relatively small. The density of elements disposed within the dense region B is relatively large, which means the quotient of the entire size of the elements in the dense region B divided by the area of dense region B is also relatively large. The substrate 10 of the present invention may be a bulk silicon substrate, a germanium substrate, a gallium arsenide substrate, a silicon germanium substrate, an indium phosphide substrate, a gallium nitride substrate, a silicon carbide substrate, a silicon on insulator (SOI) substrate or other suitable materials. In addition, the substrate 10 may be a fin structure or a planar structure.

At least one dummy gate 12 is formed with in the iso region A and the dense region B, respectively. A spacer (not shown) is formed at two sides of the dummy gates 12. Subsequently, an etching stop layer 14 is optionally formed to conformally cover the dummy gates 12. Then, a dielectric layer 16 is formed to cover the iso region A and the dense region B entirely. The dielectric layer 16 is etched to expose the dummy gate 12 within the iso region A and the dense region B.

Figure 2:
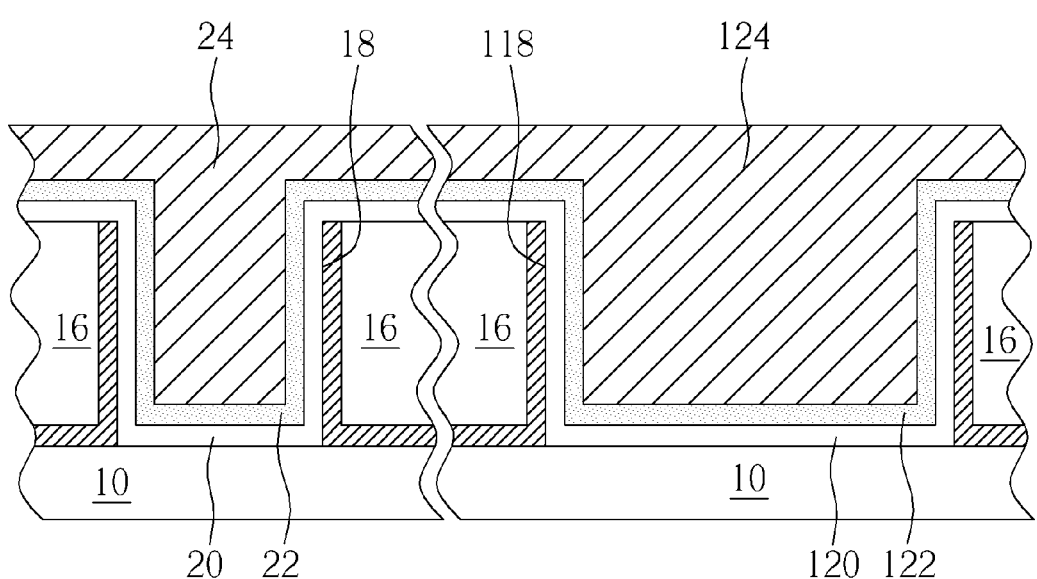

As shown in FIG. 2, the dummy gate 12 within the iso region A and the dense region B are removed. After that, a first trench 18 and a second trench 118 are formed within the dense region B and the iso region A in the dielectric layer 16, respectively. Next, a first gate dielectric layer 20, a first material layer 22 and a first metal layer 24 are formed in the first trench 18 in sequence. A second gate dielectric layer 120, a second material layer 122 and a second metal layer 124 are also formed in the second trench 118 in sequence. The first gate dielectric layer 20 and the second gate dielectric layer 120 may be high-K materials such as hafnium oxide, zirconium oxide or other suitable materials. The first material layer 22 may include a work function layer, a barrier layer of combination thereof. The second material layer 122 may include a work function layer, a barrier layer of combination thereof. The work function layer may be aluminum nitride, titanium nitride, or other metal layer. The work function layer may be aluminum nitride for forming an NMOS transistor, but it is not limited thereto. In another embodiment, the word function layer may be titanium nitride for forming a PMOS transistor. The barrier layer is to prevent metals disposed above from diffusing downwards to other material layers. The barrier layer may be a single layer structure or a multilayer structure composed of tantalum nitride or titanium nitride etc.

In addition, the first metal layer 24 and the second metal layer 124 may independently be aluminum, tungsten, or other suitable metals or alloys. Based on different requirements, the first gate dielectric layer 20 and the second gate dielectric layer 120 may be the same or different materials. The first material layer 22 and the second material layer 122 may be the same or different materials. The first metal layer 24 and the second metal layer 124 may be the same or different materials. If the first gate dielectric layer 20 and the second gate dielectric layer 120 are the same material, they can be formed in the same step. If the first material layer 22 and the second material layer 122 are the same material, they can be formed in the same step. If the first metal layer 24 and the second metal layer 124 are the same material, they can be formed in the same step.

Figure 3:
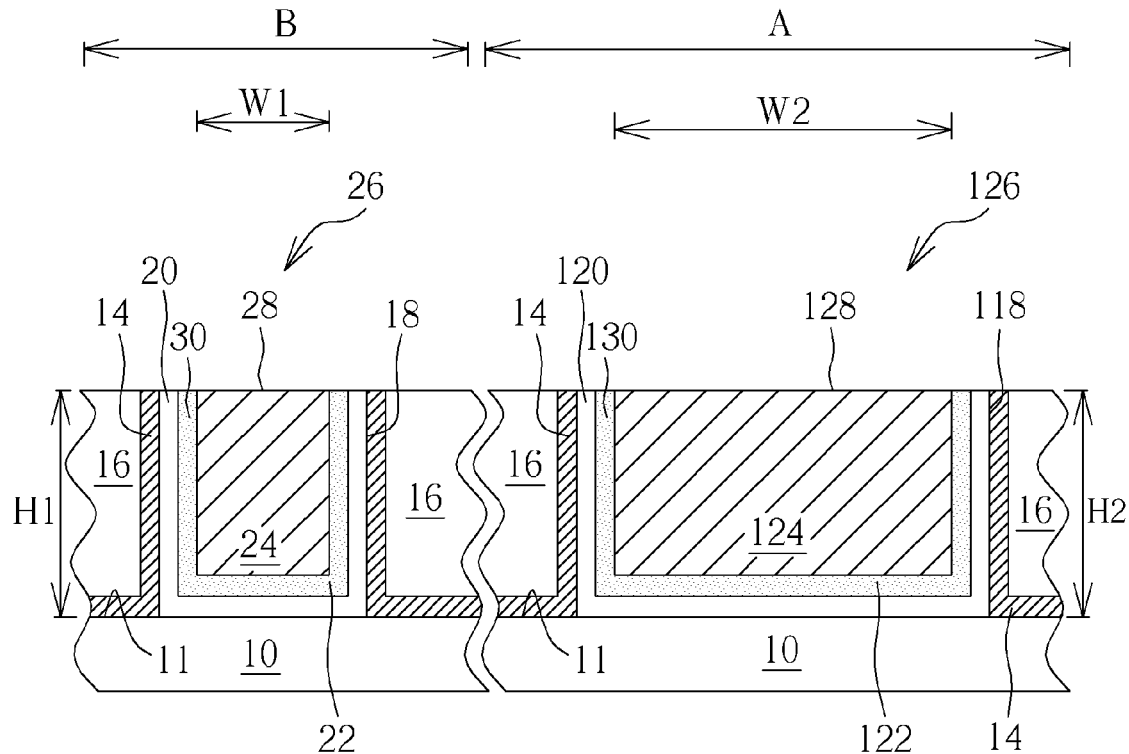

As shown in FIG. 3, the first metal layer 24 and the second metal layer 124, the first material layer 22, the second material layer 122, the first gate dielectric layer 20 and the second gate dielectric layer 120 are planarized to expose the dielectric layer 16. At this point, a semi-finished product of the first metal gate structure 26 and a semi-finished product of the second metal gate structure 126 are formed. The first metal layer 24 and the second metal layer 124 are at the same height, and the first metal layer 24, the first gate dielectric layer 20, the first material layer 22 and the dielectric layer 16 are aligned. The second metal layer 124, the second gate dielectric layer 120, the second material layer 122 and the dielectric layer 16 are also aligned A distance between a top surface 28 of the first metal layer 24 and a top surface 11 of the substrate 10 is defined as a height H1 of the first metal layer 24. A distance between a top surface 128 of the second metal layer 124 and a top surface 11 of the substrate 10 is defined as a height H2 of the second metal layer 124. The height H1 is the same of the height H2. In this embodiment, a width W2 of the second metal layer 124 is greater than the width W1 of the first metal layer 24. In other embodiments, however, the width W2 of the second metal layer 124 may be smaller than the width W1 of the first metal layer 24. The first material layer 22 and the second material layer 122 are both U shaped. The first material layer 22 has a first vertical sidewall 30. The second material layer 122 has a second vertical sidewall 130. The first gate dielectric layer 20 and the second gate dielectric layer 120 are also U shaped.

Figure 4:
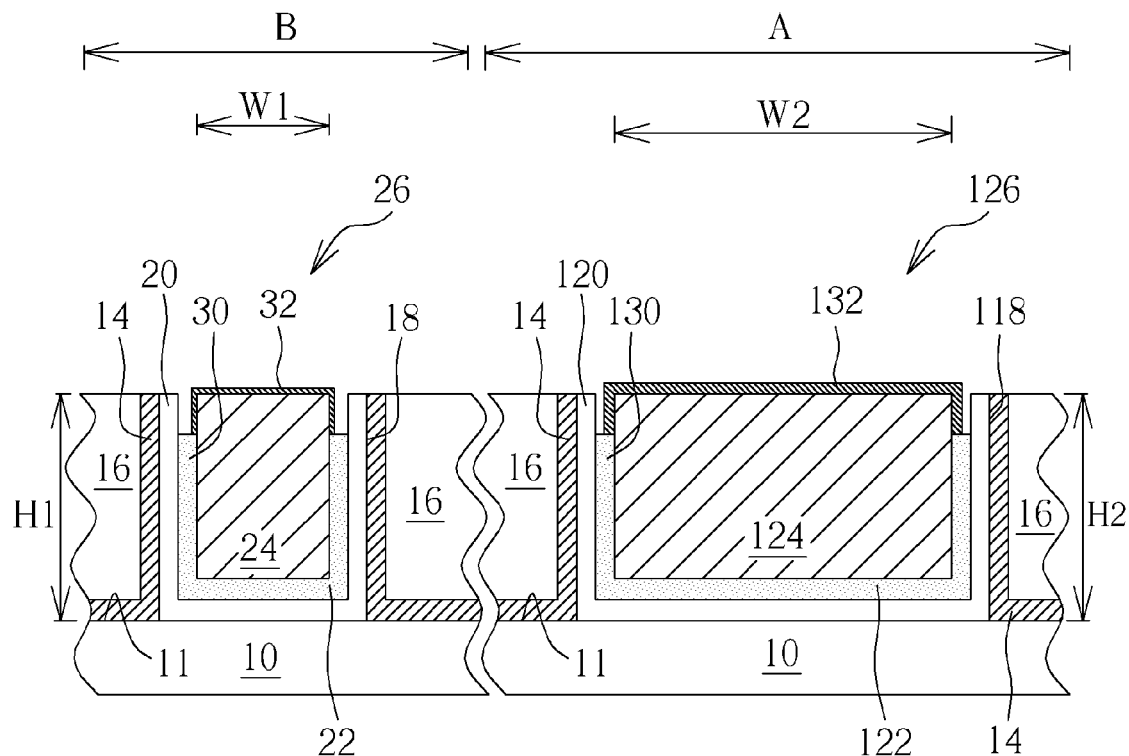

As shown in FIG. 4, a first etching process is performed by utilizing a dry etching to anisotropically remove part of the first vertical sidewall 30 and part of the second vertical sidewall 130. According to a preferred embodiment of the present invention, the etchant of the dry etching may be a mixture of Cl2/BCl3/O2. During the dry etching, a first polymer film 32 and a second polymer film 132 are formed on the first metal layer 24 and the second metal layer 124. The second polymer film 132 is thicker than the first polymer film 32. The first polymer film 32 and the second polymer film 132 are both formed by residues during the dry etching.

Figure 5:
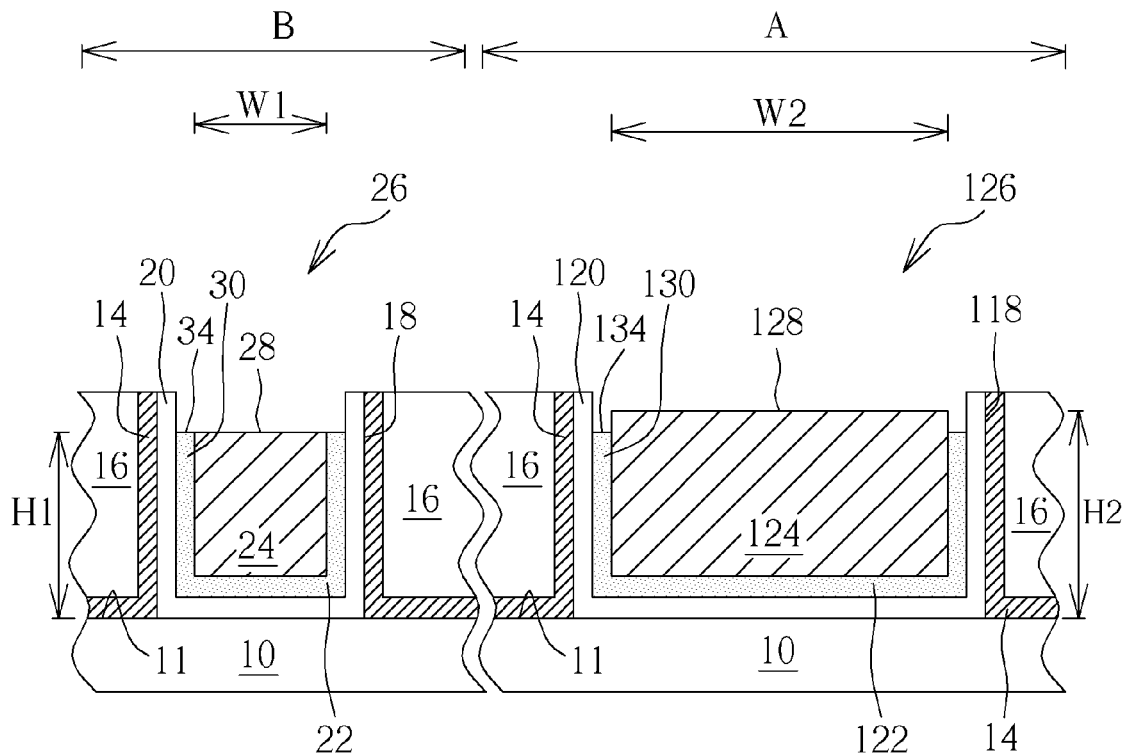

As shown in FIG. 5, a second etching process is performed by utilizing another dry etching to anisotropically remove part of the first metal layer 24 and part of the second metal layer 124 until the top surface 28 of the first metal layer 24 is aligned with the top surface 34 of the first vertical sidewall 30. Before removing the part of the first metal layer 24 and the part of the second metal layer 124, the first polymer film 32 and the second polymer film 132 must be removed in advance. Because the second polymer film 132 is thicker, the first polymer film 32 will be consumed prior to the second polymer film 132 so that the first metal layer 24 will be etched before the second metal layer 124. In other words, the first metal layer will be etched longer during the second etching process. Therefore, at the end of the second etching process, the first metal layer 24 is etched more than the second metal layer 124. The height of the second metal layer 124 then becomes a height H2'. The height of the first metal layer 124 becomes a height H1'. The height H2' is greater than the height H1'. A distance between the top surface 28 of the first metal layer 24 and the top surface 11 of the substrate 10 is defined as a height H1' of the first metal layer 24. A distance between the top surface 128 of the second metal layer 124 and the top surface 11 of the substrate 10 is defined as a height H2' of the second metal layer 124. The top surface 128 of the second metal layer 124 is higher than the top surface 134 of the second vertical sidewall 130. The etchant of the second etching process may be a mixture of Cl2/O2/N2/NF3/SiCl4.

Figure 6:
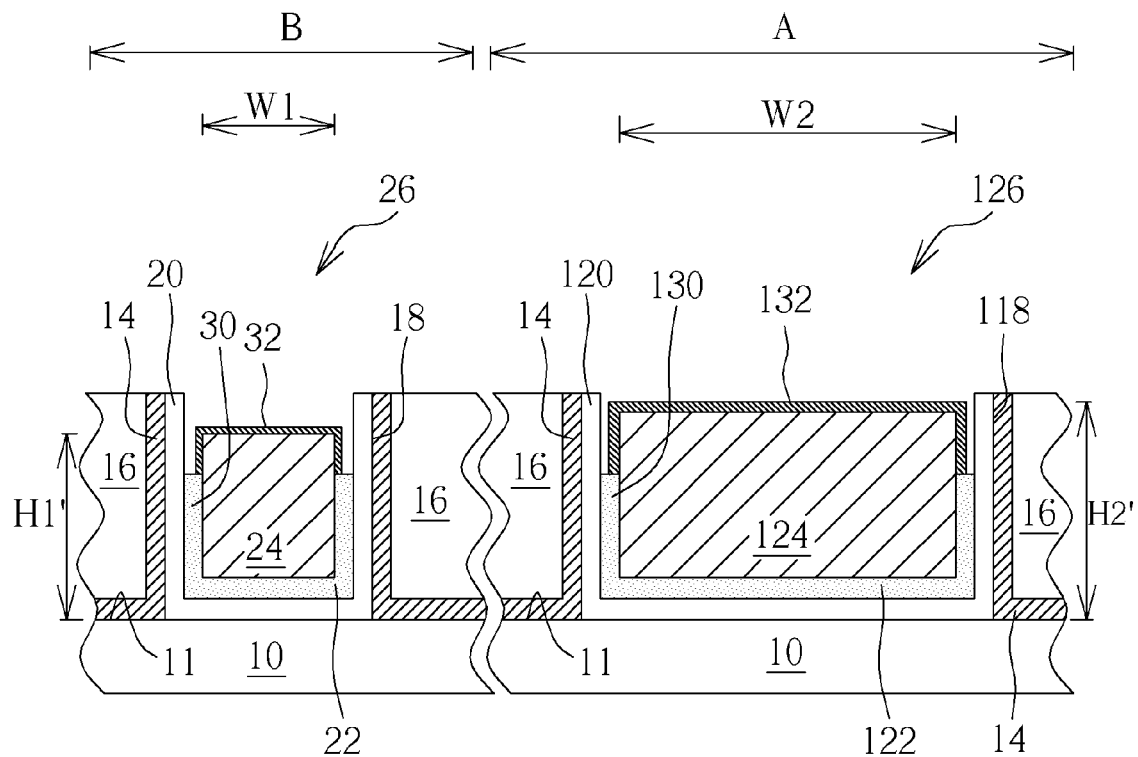
Figure 7:
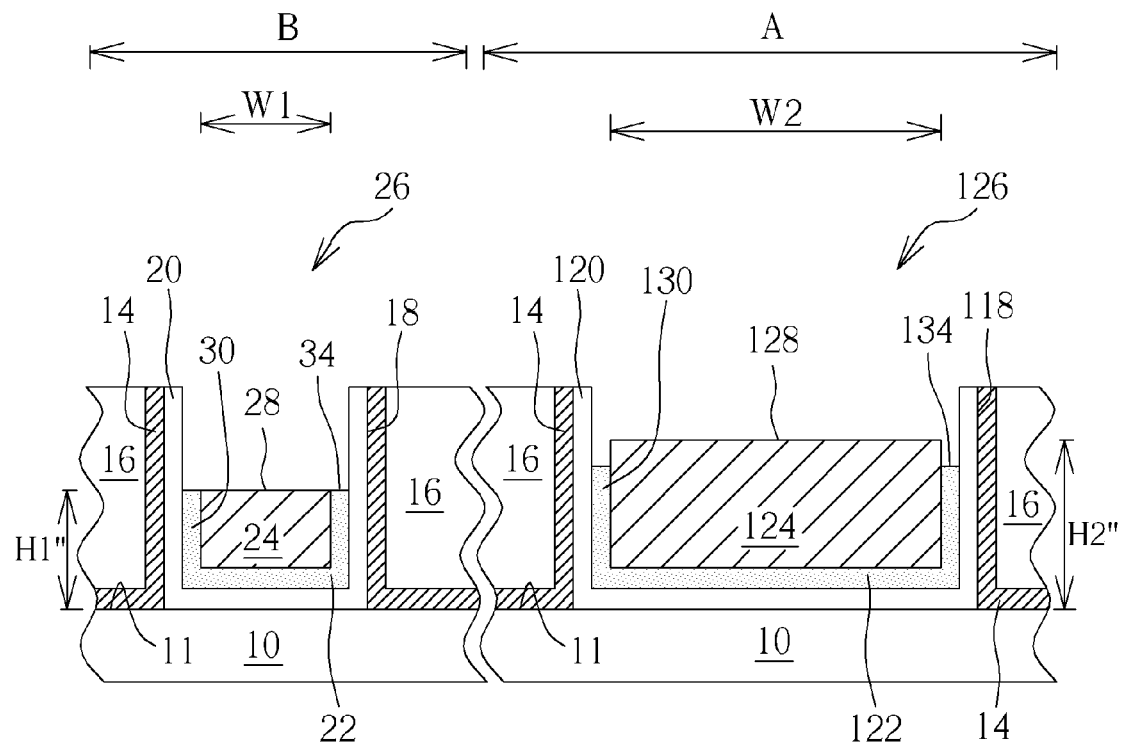

The height H1' of the first metal layer 24 is checked to see if it reaches a predetermined height. The width W1 and predetermined height of the first metal layer 24 ensure that the first metal layer 24 has an adequate resistance. If the height H1' of the first metal layer 24 reaches the predetermined height, the step of removing the gate dielectric layer is performed. If the height H1' of the first metal layer 24 does not reach the predetermined height, the first etching process and the second etching process are repeated until the height H1' of the first metal layer 24 reaches the predetermined height. The number of times for repeating the first etching process and the second etching process are not limited. For example, as shown in FIG. 6, when the height H1' of the first metal layer 24 does not reach the predetermined height, the first etching process is performed again. During the first etching process, part of the first vertical sidewall 30 and part of the second vertical sidewall 130 are removed again anisotropically. Similarly, another first polymer film 32 and another second polymer film 132 are formed. Refer to the description related to FIG. 4 for details of the first etching process in this step.

The second etching process is performed again, during which, part of the first metal layer 24 and part of the second metal layer 124 are etched simultaneously and anisotropically until the top surface 28 of the first metal layer 24 and the top surface 34 of the vertical sidewall 30 are aligned. The height of the second metal layer 124 then becomes a height H2", and the height of the first metal layer 124 becomes a height H1", wherein the height H2" is greater than the height H1". A distance between the top surface 28 of the first metal layer 24 and the top surface 11 of the substrate 10 is defined as a height H1" of the first metal layer 24. A distance between the top surface 128 of the second metal layer 124 and the top surface 11 of the substrate 10 is defined as a height H2" of the second metal layer 124. Refer to the description related to FIG. 5 for details of the second etching process of this step.

Figure 8:
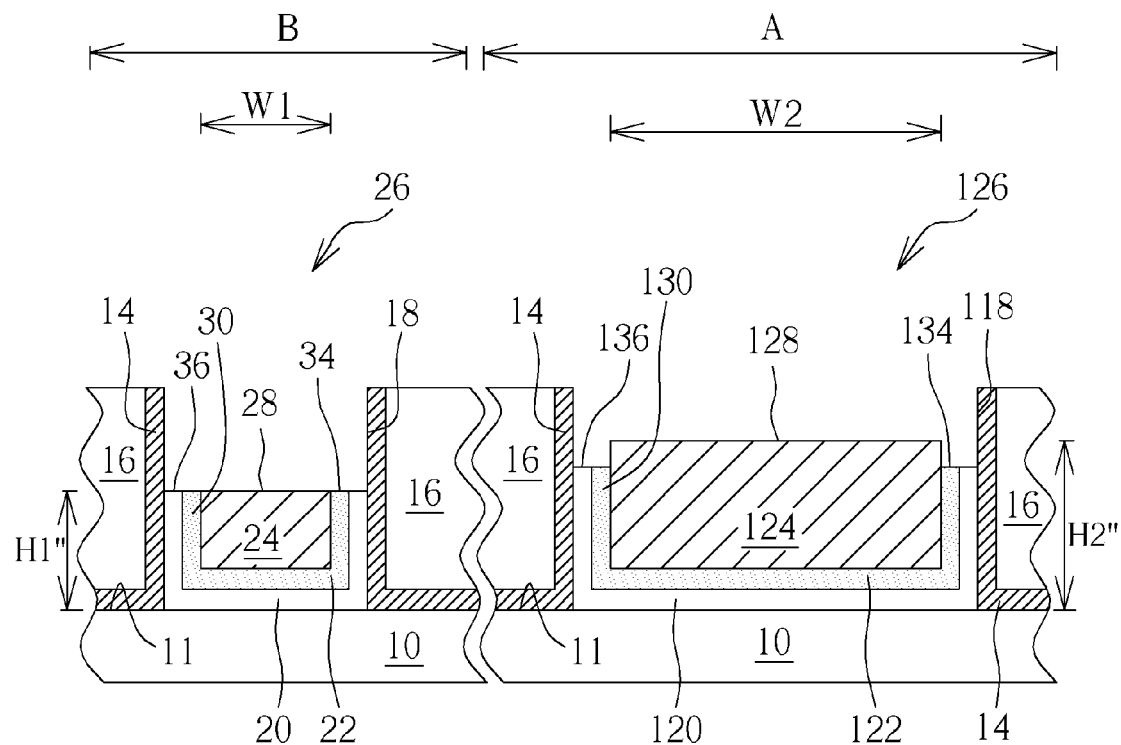

The height H1" of the first metal layer 24 is checked to see if it reaches the predetermined height. Assuming the height H1" of the first metal layer 24 reaches the predetermined height, the step of removing the gate dielectric layer is performed. Refer to FIG. 8. Part of the first gate dielectric layer 20 and part of the second gate dielectric layer 120 are removed by dry etching to make a top surface 36 of the first gate dielectric layer 20 align with the top surface 34 of the vertical sidewall 30, and a top surface 136 of the second gate dielectric layer 120 align with the top surface 134 of the vertical sidewall 130. The etchant in this step can be a mixture of Cl2/BCl3. Then, the first gate dielectric layer 20 and the second gate dielectric layer 120 can be optionally washed by dilute hydrofluoric acid to make sure the first gate dielectric layer 20 above the top surface 34 and the second gate dielectric layer 120 above the top surface 134 are removed entirely.

Figure 9:
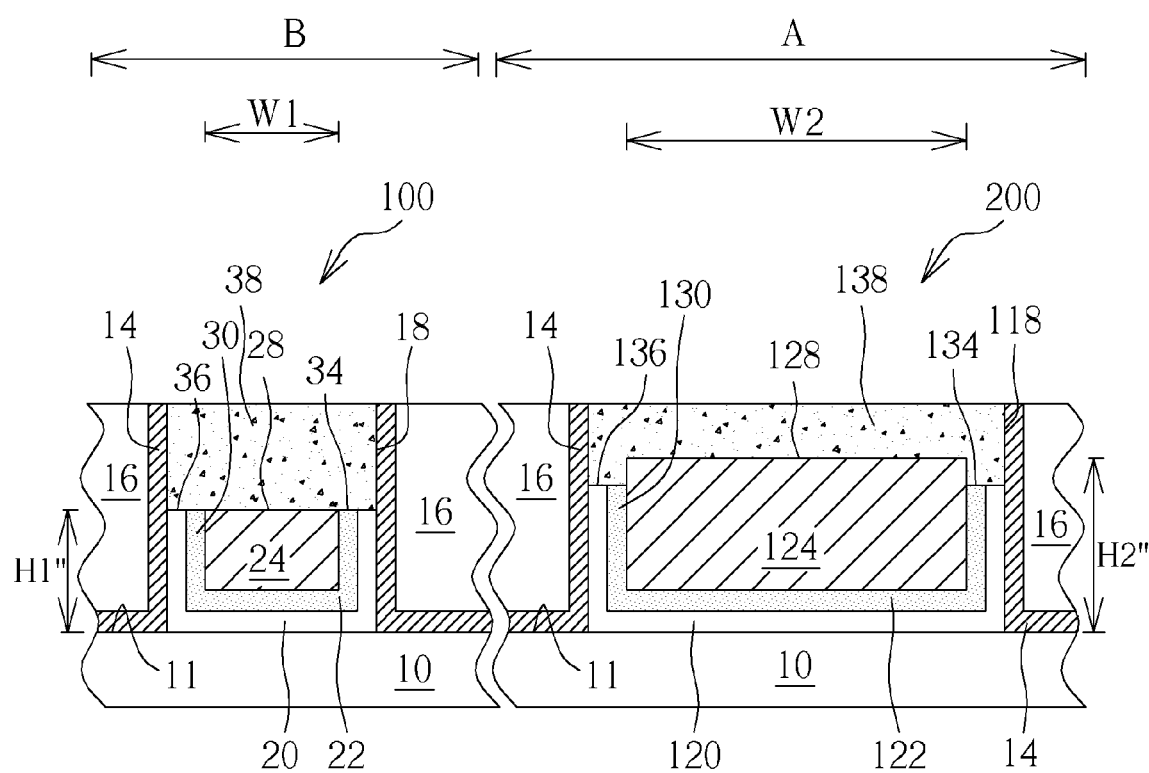

As shown in FIG. 9, a material layer (not shown) is formed on the first metal layer 24 and the second metal layer 124, respectively. A chemical mechanical polishing is performed to make the material layer align with the dielectric layer 16 to form a first cap layer 38 and a second cap layer 138, respectively, on the first metal layer 24 and the second metal layer 124. A first metal gate structure 100 and a second metal gate structure 200 are completed at this point.

Please still refer to FIG. 9. According to a preferred embodiment of the present invention, the metal gate structure includes a substrate 10 having an iso region A and a dense region B thereon. A dielectric layer 16 covers the iso region A and the dense region B. A first metal gate structure 100 is disposed within the dense region B. A second metal gate structure 200 is disposed within the iso region A. The first metal gate structure 100 includes a first trench 18 disposed in the dielectric layer 16 within the dense region B. A first gate dielectric layer 20, a first material layer 22 and a first metal layer 24 are disposed in the first trench 18. The first gate dielectric layer 20 contacts the substrate 10. A first material layer 22 is between the first metal layer 24 and the first gate dielectric layer 20. The first material layer 22 is U shaped, and the first material layer 22 has a first vertical sidewall 30. The second metal gate structure 200 includes a second trench 118 disposed in the dielectric layer 16 within the iso region A. A second gate dielectric layer 120, a second material layer 122 and a second metal layer 124 are disposed in the second trench 118. The second gate dielectric layer 120 contacts the substrate 10. A second material layer 122 is between the second metal layer 124 and the second gate dielectric layer 120. The second material layer 122 is U shaped, and the second material layer 122 has a second vertical sidewall 130. In addition, an etching stop layer 14 can be formed between the first gate dielectric layer 20 and the dielectric layer 16 and between the second gate dielectric layer 120 and the dielectric layer 16. A first cap layer 38 covers the first metal layer 24. A second cap layer 138 covers the second metal layer 124. The width W2 of the second metal layer 124 is larger than the width W1 of the first metal layer 24. The substrate 10 of the present invention may be a bulk silicon substrate, a germanium substrate, a gallium arsenide substrate, a silicon germanium substrate, an indium phosphide substrate, a gallium nitride substrate, a silicon carbide substrate, a silicon on insulator (SOI) substrate or other suitable materials. In addition, the substrate 10 may be a fin structure or a planar structure. The first gate dielectric layer 20 and the second gate dielectric layer 120 may be high-K material such as hafnium oxide, zirconium oxide or other suitable materials. The first material layer 22 may include a work function layer, a barrier layer or combination thereof. The second material layer 122 may include a work function layer, a barrier layer or combination thereof. The work function layer may be aluminum nitride, titanium nitride, or other metal layer. The work function layer may be aluminum nitride for forming an NMOS transistor, but it is not limited thereto. In another embodiment, the work function layer may be titanium nitride for forming a PMOS transistor. The barrier layer may be a single layer structure or a multilayer structure composed of tantalum nitride or titanium nitride etc. In addition, the first metal layer 24 and the second metal layer 124 may independently be aluminum, tungsten, or other suitable metals or alloys. Based on different requirements, the first gate dielectric layer 20 and the second gate dielectric layer 120 may be the same or different materials. The first material layer 22 and the second material layer 122 may be the same or different materials. The first metal layer 24 and the second metal layer 124 may be the same or different materials. A distance between the top surface 28 of the first metal layer 24 and the top surface 11 of the substrate 10 is defined as a height H1" of the first metal layer 24. A distance between the top surface 128 of the second metal layer 124 and the top surface 11 of the substrate 10 is defined as a height H2" of the second metal layer 124. The height H2" is greater than the height H1". Moreover, a top surface 134 of the second vertical sidewall 130 is higher than a top surface 34 of the first material layer 22. A top surface 28 of the first metal layer 24 and a top surface 34 of the first vertical sidewall 30 are aligned. A top surface 36 of the first gate dielectric layer 20 and the top surface 34 of the first vertical sidewall 30 are aligned. A top surface 136 of the second gate dielectric layer 120 and the top surface 134 of the second vertical sidewall 130 are aligned.

The method of the present invention ensures that the metal gate in the iso region is higher than the metal gate in the dense region. Because the fabricating method takes the height of the metal gate in the dense region as a parameter, as long as the height of the metal gate in the dense region reaches the predetermined height, it can be assured that the metal gate in the iso region is not over etched. In this way, the material layer within the iso region under the metal gate will also not be over etched.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of making a metal gate structure, the method being applied to a semi-finished product of a metal gate structure, the semi-finished product comprising a substrate, the substrate comprising a dense region and an iso region, a dielectric layer covering the dense region and the iso region, a first trench disposed in the dielectric layer within the dense region, a first gate dielectric layer, a first material layer, and a first metal layer disposed in the first trench, the first gate dielectric layer contacting the substrate, the first material layer disposed between the first metal layer and the first gate dielectric layer, wherein the first material layer is U shaped, and the first material layer has a first vertical sidewall, the method of making a metal gate structure comprising the following steps:

Step (a): removing part of the first vertical sidewall of the first material layer;

Step (b): after removing part of the first vertical sidewall, removing part of the first metal layer to make a top surface of the first metal layer aligned with a top surface of the first vertical sidewall; and Step (d): removing part of the first gate dielectric layer to make a top surface of the first gate dielectric layer aligned with the top surface of the first vertical sidewall.

2. The method of making a metal gate structure of claim 1, further comprising:

Step (c): repeating step (a) and step (b) until the first metal layer has a predetermined height.

3. The method of making a metal gate structure of claim 1, wherein the semi-finished product further comprises:

a second trench disposed in the dielectric layer within the iso region; and a second gate dielectric layer, a second material layer and a second metal layer disposed within the second trench, the second gate dielectric layer contacting the substrate, the second material layer disposed between the second metal layer and the second gate dielectric layer, wherein the second material layer is U-shaped and has a second vertical sidewall.

4. The method of making a metal gate structure of claim 3, wherein step (a) further comprises the following steps:

when removing part of the first vertical sidewall, removing part of the second vertical sidewall simultaneously;
step (b) further comprises the following steps:
when removing part of the first metal layer, removing part of the second metal layer simultaneously; and
step (d) further comprises the following steps:
when removing part of the first gate dielectric layer, removing part of the second gate dielectric layer simultaneously so as to make a top surface of the second gate dielectric layer aligned with a top surface of the second vertical sidewall.

5. The method of making a metal gate structure of claim 4, further comprising:
Step (c): repeating step (a) and step (b) until the first metal layer has a predetermined height.

6. The method of making a metal gate structure of claim 4, further comprising after the step (d), washing the first gate dielectric layer and the second dielectric layer by dilute hydrofluoric acid.

7. The method of making a metal gate structure of claim 5, wherein after the step (c), a height of the second metal layer is greater than a height of the first metal layer.

8. The method of making a metal gate structure of claim 4, wherein after the step (b), a height of the second metal layer is greater than a height of the first metal layer.

9. The method of making a metal gate structure of claim 4, wherein during the step (a), the part of the first vertical sidewall and the part of the second vertical sidewall are removed by a dry etching process, and a first polymer film and a second polymer film are formed on the first metal layer and the second metal layer, respectively, wherein the second polymer film is thicker than the first polymer film.

10. The method of making a metal gate structure of claim 3, wherein a width of the second metal layer is greater than a width of the first metal layer.

11. The method of making a metal gate structure of claim 3, wherein the first gate dielectric layer and the second gate dielectric layer are made in the same step with the same material, and the first metal layer and the second metal layer are made in the same step with the same material.

12. The method of making a metal gate structure of claim 1, wherein the first material layer comprises a first barrier and a first work function layer.

13. The method of making a metal gate structure of claim 1, further comprising:
forming a first cap layer and a second cap layer on the first metal layer and on the second metal layer, respectively, to complete the metal gate structure.

\* \* \* \* \*